(12) United States Patent
Zhu et al.

(10) Patent No.: US 7,247,547 B2
(45) Date of Patent: Jul. 24, 2007

(54) METHOD OF FABRICATING A FIELD EFFECT TRANSISTOR HAVING IMPROVED JUNCTIONS

(75) Inventors: Huilong Zhu, Poughkeepsie, NY (US); Oleg Gluschenkov, Poughkeepsie, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 10/905,454

(22) Filed: Jan. 5, 2005

(65) Prior Publication Data

US 2006/0148215 A1    Jul. 6, 2006

(51) Int. Cl.
*H01L 21/20* (2006.01)
*H01L 21/36* (2006.01)

(52) U.S. Cl. ............... 438/486; 438/301; 438/482; 257/E21.335; 257/E21.337

(58) Field of Classification Search ........... 438/293, 438/301, 482, 486, 527; 257/E21.335, E21.337
See application file for complete search history.

(56) References Cited

U.S. PATENT DOCUMENTS

| | | | |
|---|---|---|---|
| 4,431,459 A | 2/1984 | Teng | |
| 5,602,045 A * | 2/1997 | Kimura | 438/305 |
| 6,008,098 A * | 12/1999 | Pramanick et al. | 438/305 |
| 6,127,216 A | 10/2000 | Yu | |
| 6,294,415 B1 * | 9/2001 | Tseng et al. | 438/197 |
| 6,355,543 B1 | 3/2002 | Yu | |
| 6,365,476 B1 | 4/2002 | Talwar et al. | |
| 6,680,250 B1 | 1/2004 | Paton et al. | |
| 6,703,281 B1 | 3/2004 | Yu | |
| 6,709,960 B1 | 3/2004 | Xiang | |
| 6,897,118 B1 * | 5/2005 | Poon et al. | 438/303 |
| 6,936,505 B2 * | 8/2005 | Keys et al. | 438/166 |
| 7,091,097 B1 * | 8/2006 | Paton et al. | 438/303 |

* cited by examiner

*Primary Examiner*—Fernando L. Toledo
(74) *Attorney, Agent, or Firm*—Daryl K. Neff, Esq.; H. Daniel Schnurmann

(57) ABSTRACT

A method of forming a field effect transistor is provided which includes forming an amorphized semiconductor region having a first depth from a single-crystal semiconductor region and subsequently forming a first gate conductor above a channel portion of the amorphized semiconductor region. A first dopant including at least one of an n-type dopant and a p-type dopant is then implanted to a second depth into portions of the amorphized semiconductor region not masked by the first gate conductor to form source/drain portions adjacent to the channel portion. The substrate is then heated to recrystallize the channel portion and the source/drain portions of the amorphized semiconductor region. After the heating step, at least a part of the recrystallized semiconductor region is locally heated to activate a dopant in at least one of the channel portion and the source/drain portion.

13 Claims, 5 Drawing Sheets

METHOD OF FABRICATING A FIELD EFFECT TRANSISTOR HAVING IMPROVED JUNCTIONS

BACKGROUND OF THE INVENTION

The present invention relates to active semiconductor devices and their fabrication, and more particularly to a structure and method of fabricating a field effect transistor.

It is highly desirable for field effect transistors having deep sub-micron dimensions (those having conduction channels of width less than about 50 nm) to have very sharp and small junction depth. Conventional methods of annealing by which an implanted substrate is heated to drive the diffusion of dopants do not produce sufficiently abrupt and small junction depth because the dopants move too far under such heating. Methods of laser annealing, by contrast, can produce sufficiently small junction depth. However, when the substrate is not heated long enough, dislocations in the crystal structure of the semiconductor remain at the boundary between an implanted region of the crystalline semiconductor and unimplanted regions. These dislocations lead to problems, such as unacceptably high leakage current and/or high external resistance. The FET structures and methods described herein are suited to address such problems.

SUMMARY OF THE INVENTION

According to an aspect of the invention, a method of forming a field effect transistor is provided which includes forming an amorphized semiconductor region having a first depth from a single-crystal semiconductor region and subsequently forming a first gate conductor above a channel portion of the amorphized semiconductor region. A first dopant including at least one of an n-type dopant and a p-type dopant is then implanted to a second depth into portions of the amorphized semiconductor region not masked by the first gate conductor to form source/drain portions adjacent to the channel portion. The substrate is then heated to recrystallize the channel portion and the source/drain portions of the amorphized semiconductor region. After the heating step, at least a part of the recrystallized semiconductor region is locally heated through a non-melting laser anneal or rapid thermal annealing, for example, to activate a dopant in at least one of the channel portion and the source/drain portion.

DETAILED DESCRIPTION OF THE INVENTION

Figure 1A:
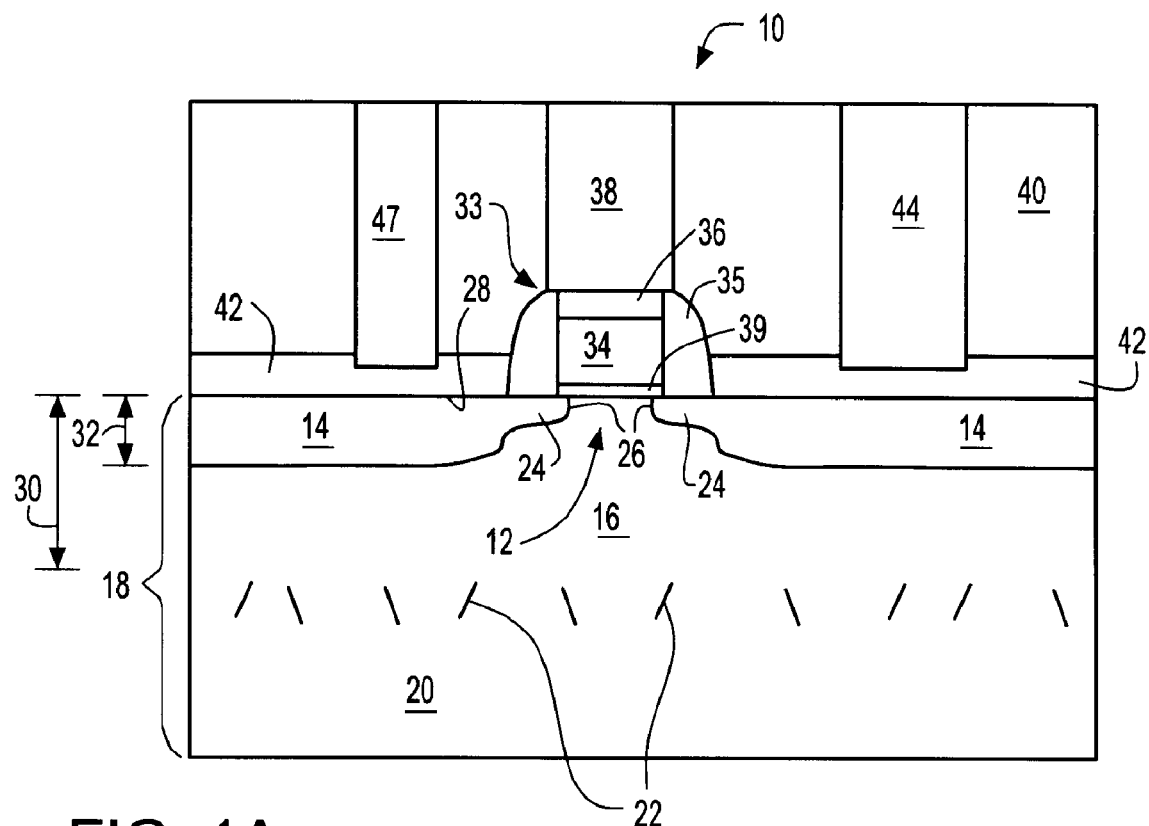
FIG. 1A is a sectional view illustrating a structure of a field effect transistor formed from a bulk substrate according to one embodiment of the invention.

FIG. 1A illustrates a field effect transistor (FET) 10 according to an embodiment of the invention. As shown therein, the FET includes a channel region 12 in a first single-crystal region 16 of a substrate and a pair of source/drain regions 14 flanking the channel region 12 in portions of the single-crystal region 16 adjacent to the channel region 12. The invention will be described first with reference to an embodiment in which the single-crystal region 16 is disposed within a bulk substrate 18. Then, the necessary modifications will be described for an embodiment in which the single-crystal region 16 forms the active device layer of a semiconductor-on-insulator (SOI) substrate.

As shown in FIG. 1A, defects, e.g., dislocations 22 in the crystal structure define a boundary between the first single-crystal region 16 in which the channel region 12 and the source/drain regions 14 are disposed, and a lower single-crystal portion 20 of the substrate 18 below the first single-crystal region 16. When such crystal defects are located at a boundary between two single-crystal regions of a substrate which have the same predominant n-type or p-type doping, they produce little effect upon the FET and its operation. However, often, a great number of such dislocations are present at the boundary between n-type and p-type single-crystal regions, i.e., at p-n junctions. Such dislocations, known as "end-of-range dislocations," detract from the performance of the FET.

Dislocations at p-n junctions contribute to undesirable leakage current when the transistor is biased at a voltage below its threshold voltage. Leakage current is undesirable because it contributes to higher steady state power consumption of an electronic component which includes the transistor, causing the component to dissipate more heat. When the component is battery powered, unnecessary power consumption causes the component to require more frequent recharging and/or battery replacement. High leakage current also decreases the retention time of memory cells which include capacitive storage devices, such as the memory cells of a dynamic random access memory (DRAM).

In one embodiment, FET 10 is a p-type FET which is disposed within a first, n-type single-crystal region 16 of the semiconductor substrate. In such embodiment, the source/drain regions 14 of the FET are predominantly doped p-type and are at least moderately heavily doped but may be heavily doped. A pair of more lightly doped source/drain extension regions 24 (hereinafter, "extension regions") are disposed between the channel region 12 and the source/drain regions 14. The location of the extension regions 24 relative to the channel region 12 is determined by the width of dielectric spacers 35 disposed on sidewalls of the gate conductor 33. The PFET 10 shown in FIG. 1A operates to produce lower leakage currents than prior art field effect transistors, because the locus of crystal defects such as dislocations 22 is far way from the p-n junctions 26 that define the boundaries between the source/drain regions and the channel region. Stated another way, the locus of crystal defects is far enough away so that there is no overlap or very little overlap between the dislocations and the p-n junction. By contrast, in some prior art, dislocations are in the region of the p-n junction.

The first single-crystal region 16 of the substrate 18 is a semiconductor region that has been recrystallized from a previously amorphized region of the substrate, as will be described more fully in the description of the fabrication method below. The first single-crystal region 16 extends to a first depth 30 below the major surface 28 of the substrate 18. On the other hand, the channel region 12, the source/drain regions 14, the extension regions 24 and the p-n junctions 26 between them extend only to a second depth 32 below the major surface 28 of the substrate 18, that depth 32 being substantially less than the first depth 30. The first depth 30 is preferably selected to be 0.1 µm or more, while the second depth 30 is preferably selected to be substantially less, e.g., about 70 nm or less. In one preferred embodiment, the first depth 30 is selected to be between about 0.2 μm and 0.5 μm, a value which places the dislocations 22 at a significant distance from the p-n junctions 26 which are present at a depth of less than about 70 nm.

As the channel region 12, the extension regions 24, the source/drain regions 14 and the p-n junctions 26 between them are all located in one single-crystal region 16 that has been recrystallized from the amorphized region, few dislocations are present at the p-n junctions. For that reason, the transistor exhibits little leakage current due to dislocations at the p-n junctions.

Another feature of FET 10 is that the p-n junctions 26 are characterized by a sharp doping profile. Stated another way, the concentration of each type of dopant changes very abruptly across the p-n junction such that the junctions have small depth. As an example of the sharp doping profile that is achieved, the concentration of n-type dopants in the FET changes by two orders of magnitude or more within a distance of less than about five nanometers across the p-n junction. Similarly, the concentration of p-type dopants across the junction changes by two orders of magnitude or more within a distance of less than about five nanometers. Another advantage is that abrupt p-n junctions improve short channel effect of FETs, which becomes troublesome with scaling down of gate length.

As further shown in FIG. 1A, the FET 10 includes a gate conductor 33 having a first layer 34, which may consist essentially of a polycrystalline semiconductor, e.g., polysilicon, a metal or other conductive material. Optionally, the gate conductor 33 includes a silicide layer 36 disposed over the first layer 34. In a particular embodiment, the gate conductor 33 includes a replacement gate conductor which is formed after the source/drain regions are formed in the single-crystal region 16, as will be described more fully below. Conductive contact to the gate conductor 33 is provided through a conductive via 38 disposed within a dielectric region 40. Similarly, a silicide layer 42 is disposed in contact with the source/drain regions 14 of the FET 10, and conductive vias 44 and 47 providing conductive contact to the source/drain regions 14 by way of the silicide layer 42.

Figure 1B:
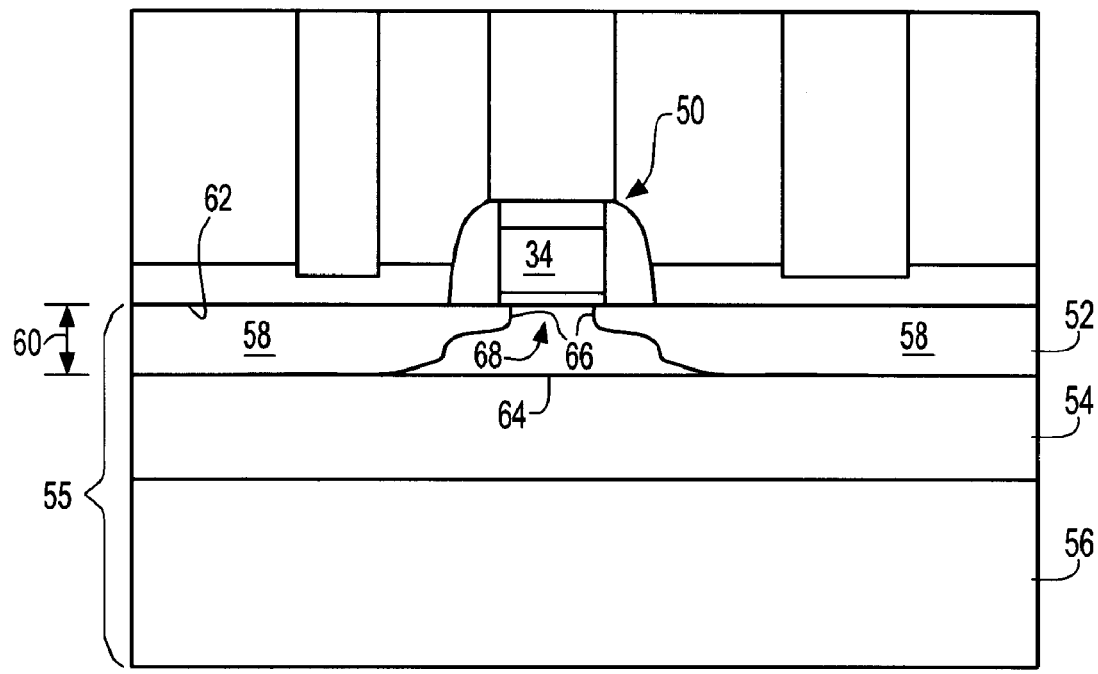
FIG. 1B is a sectional view illustrating a structure of a field effect transistor formed from a semiconductor-on-insulator (SOI) substrate according to one embodiment of the invention.

Note that it is not necessary for the FET 10 to be disposed in (and formed from) a bulk substrate 18, as shown in FIG. 1A. In another embodiment as shown in FIG. 1B, a FET 50 is provided in an active semiconductor device layer 52 of a SOI substrate 55. In such SOI substrate, the active device layer 52 is disposed above a buried oxide (BOX) layer 54, which, in turn, is disposed above a bulk semiconductor region 56 of the substrate 55. In FET 50 the recrystallized single-crystal region of the substrate 55 is preferably coextensive with the active device layer 52. In addition, the source/drain regions 58 of the FET preferably extend to the same depth 60 from the major surface 62 of the substrate as the depth of the bottom 64 of the active device layer 52, i.e., to the interface (64) between the active device layer and the BOX layer 54. By virtue of the foregoing structure, crystal defects such as dislocations are substantially eliminated from device layer 52, making no contribution to leakage current at the interface 64 and making little or no contribution at the p-n junctions 66 between the source/drain regions 58 (including any extension regions) and the channel region 68.

Figure 2:
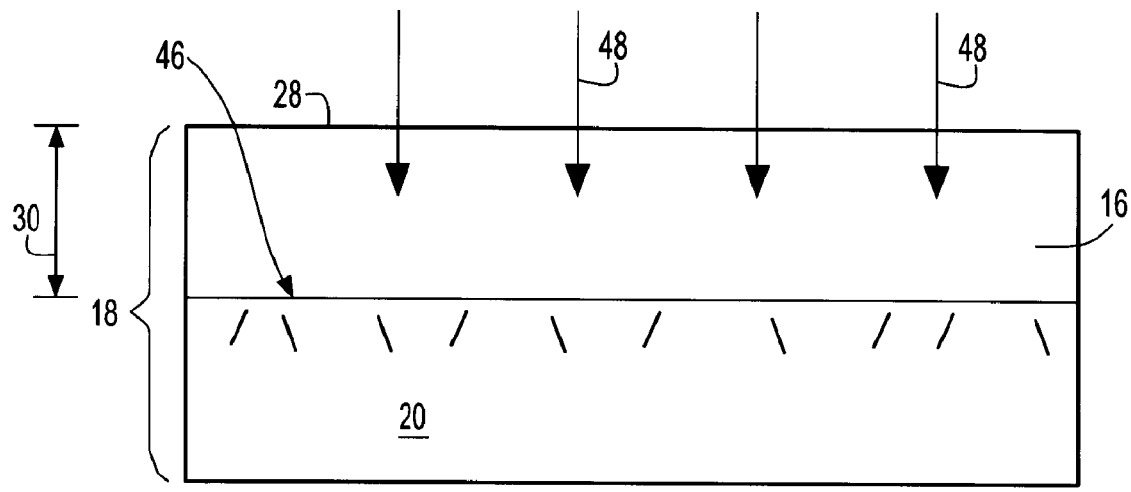
FIGS. 2 through 9 are sectional views illustrating stages in fabrication of the field effect transistor according to the embodiment shown in FIG. 1A.

A method of fabricating the FET 10 (FIG. 1A) will now be described, with reference to FIGS. 2 through 9. FIG. 2 depicts an initial stage of fabrication in which region 16 of the single-crystal semiconductor substrate 18 is amorphized by implanting non-donor particles to a depth 30 below a major surface 28 of the substrate, as indicated by arrows 48. Stated another way, the upper single-crystal region 16 is implanted with particles to an extent necessary to convert the crystal structured semiconductor material therein to an amorphous form. This results in a boundary 46 between the amorphized region 16 and the non-implanted region 20. At the boundary 46, dislocations 22 appear in the crystal structure of the semiconductor material of the substrate. The dislocations 22 are manifested as defects which occur in the crystal structure where atoms have been knocked loose from their correct positions in the crystal lattice.

The substrate 18 can be provided of silicon, germanium, or an alloy of such semiconductors such as silicon germanium, or, alternatively, the substrate 18 can consist essentially of a compound semiconductor such as a III-V compound semiconductor, for example, without limitation: GaAs and/or InP, or a II-VI compound semiconductor. In the exemplary embodiment described in the following, the substrate 18 is described as a silicon substrate. However, the substrate can be provided of any of the foregoing described semiconductor materials.

The implanted particles can be particles of semiconductor material or other material other than common dopant materials. The particles are of a type that do not react with the semiconductor material, and which are conducive to forming a part of the semiconductor crystal lattice. In one embodiment, the particles consist essentially of silicon ions. Alternatively, the particles can consist essentially of ions of another Group IV element such as germanium (Ge), or otherwise, an inert element such as xenon (Xe), for example. During this implant, the particles are implanted to a concentration of between about $10^{13}$ cm$^{-3}$ and $5 \times 10^{15}$ cm$^{-3}$, which concentration can vary somewhat based upon the number of atoms per particle. The implantation energy is varied such that the particles are distributed substantially over the implanted region from the major surface 28 of the substrate to the lower boundary 46 of the implanted region.

Figure 3:
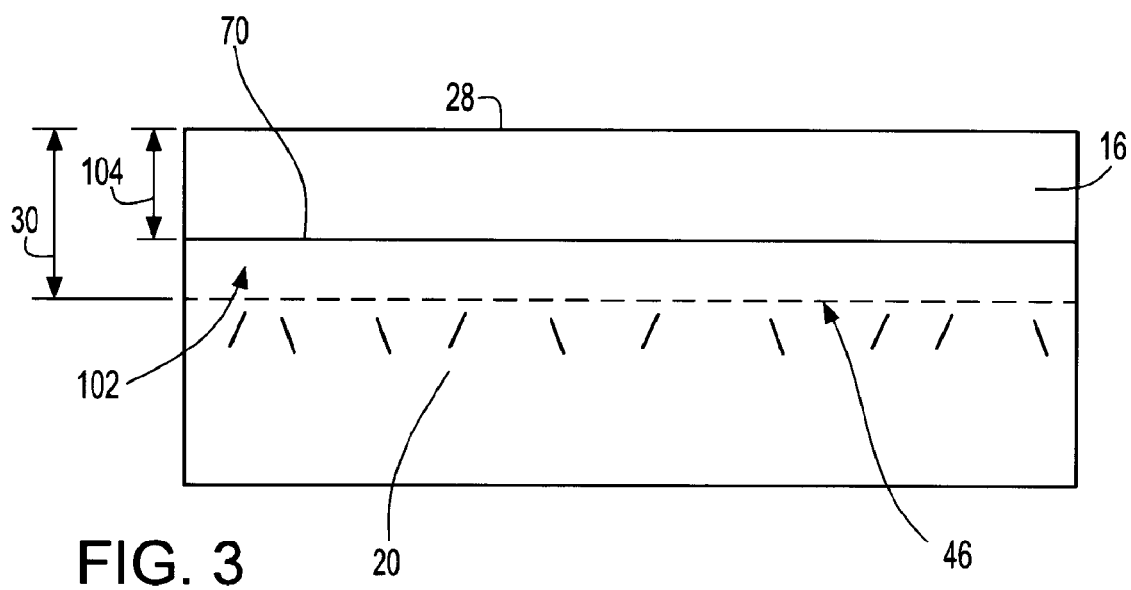

Preferably, the depth of the lower boundary 46 of the amorphized region is between about 0.1 μm and 0.2 μm, and more preferably about 0.1 μm. When the boundary 46 is greater than about 0.2 μm, additional processing is performed to reduce the thickness of the amorphized region 16, i.e., its depth 30 from the major surface 28, prior to performing the processing steps which follow. Referring to FIG. 3, to reduce the depth 30, the substrate is annealed at a relatively low temperature such as under about 650° C., and more preferably between about 550° C. and 600° C. for a period of time ranging from about 5 minutes to about one half hour. This results in a portion 102 of the amorphized layer 16 becoming recrystallized according to the crystal structure of the existing single-crystal region 20. This recrystallization process occurs in a direction moving upwardly from the original lower boundary 46 of the amorphized region towards the major surface 28, thus establishing a new lower boundary 70 of the amorphized region. Preferably, the recrystallization is performed until the depth 104 of the remaining amorphized region 16 is about 0.1 μm. As a result of the recrystallization process, the boundary of the amorphized region 16 moves from the original boundary 46 at depth 30 to the new boundary 70 at depth 104, the new boundary 70 being closer to the major surface 28 of the substrate. At the conclusion of this stage of processing, the new boundary 70 is spaced apart from the end-of-range dislocations by the difference between the depths 30 and 104.

Figure 4:
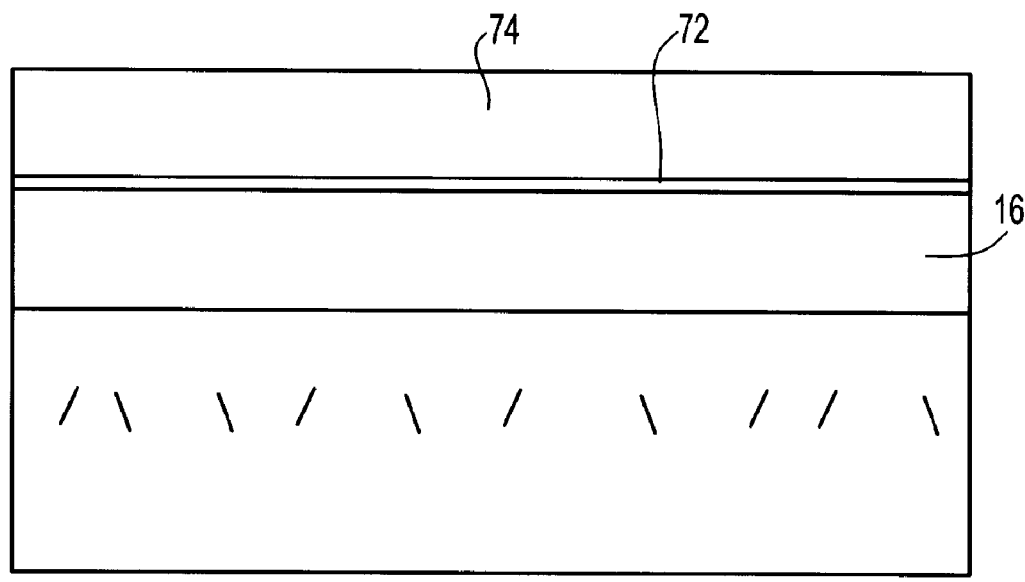

In a subsequent stage of fabrication shown in FIG. 4, a thin sacrificial dielectric layer 72 or low-temperature gate oxide is formed on the major surface of the substrate to overlie the amorphized single-crystal region 16, and a layer 74 of polycrystalline semiconductor is deposited to overlie that layer 72. A threshold voltage adjustment implant may be performed to the single-crystal region 16, either before or after the polycrystalline semiconductor layer 74 is formed. For a FET having a short gate length, i.e., one in which the width of the gate conductor is relatively small, e.g., on the order of 110 nm or less, a channel threshold voltage implant may not be needed, because of the use of halo implantation, as described with reference to FIG. 5 below. The layers 72, 74 will be used during steps in which the source/drain regions and extension regions of the transistor are patterned, but will be removed and replaced with other layers to complete the transistor. Hence, the primary function of the sacrificial layer 72 is as an etch stop layer during subsequent patterning, the layer 74 functions as a "dummy gate", i.e., a disposable mandrel, during the patterning of the source/drain regions and the extension regions. Preferably, the sacrificial layer is an oxide formed by a low temperature deposition, which need not result in a high quality oxide, although it can be good quality. Accordingly, the sacrificial layer can be formed by deposition of an oxide from a tetraethylorthosilicate (TEOS) deposition or other low-temperature deposition. Layer 74 is preferably formed by a low to moderate temperature polysilicon deposition, e.g., at a temperature under 600° C. The reason for performing these depositions at low to a moderate temperature is to avoid further recrystallization of the amorphized single-crystal region 16 which would cause the lower boundary 70 substantially move towards the major surface. Accordingly, these depositions need to be performed under conditions, which in the aggregate do not cause the lower boundary to substantially move. By way of example, this goal can be achieved if the depositions are performed at temperatures under about 600° C. for short to typical durations.

Figure 5:
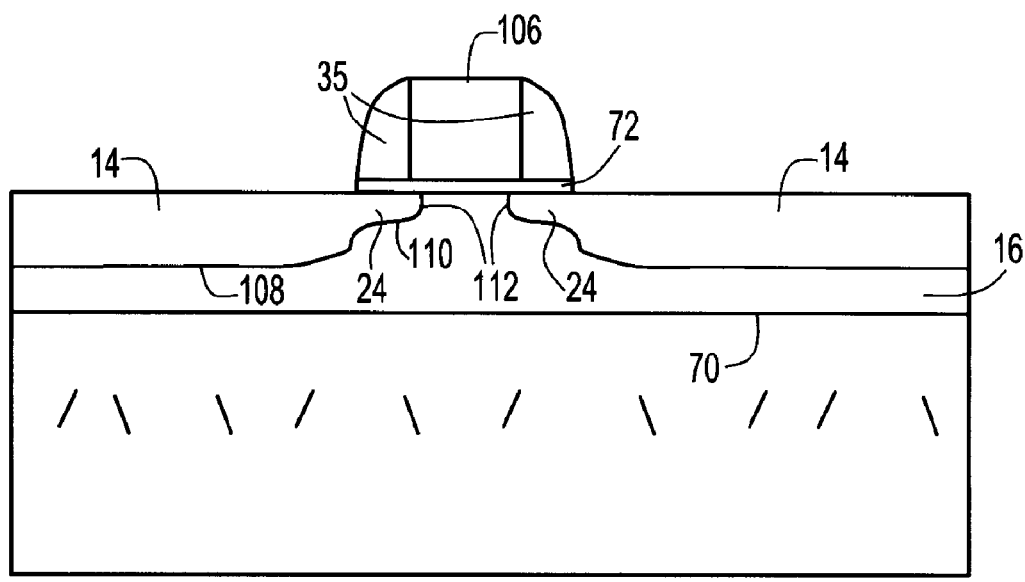

Thereafter, with reference to FIG. 5, steps are performed to define the extension regions 24 and source/drain regions 14 of the transistor. These steps are preferable performed as follows. The polysilicon layer is patterned, as by a reactive ion etch (RIE) to form a dummy gate 106, the etch process stopping on the underlying sacrificial layer 72. Using the dummy gate 106 as a mask, implants are performed to define halo and extension regions 24 in the amorphized single-crystal region 16. The implants are performed with n-type, e.g., phosphorous, arsenic, or p-type dopants, e.g. boron, and indium. For ease of reference, the halo regions are not separately shown in the figures. The implants are performed under conditions, as described above, e.g., preferably at temperatures under 500° C., to avoid substantial recrystallization of the single-crystal region 16. Thereafter, dielectric spacers 35, which consist essentially of silicon nitride, for example, are then formed by depositing and patterning silicon nitride on the sidewalls of the dummy gate 106, as by RIE, this process being performed so as to stop on the underlying sacrificial layer 72. Excess material from the nitride deposition is then cleared from the major surface 28 of the amorphized region 16, as by a wet clean process. Then, using the dummy gate 106 and the spacers 35 as a mask, source/drain regions 35 are implanted in the amorphized region 16 as counter-doped regions having a dopant type opposite to that already existing in the channel region 16. Again, the implants are performed with n-type and/or p-type dopants. Each of these steps of implanting halo and extension regions and source/drain regions needs to be performed such that the boundaries of the p-n junctions, i.e., the bottoms 108, 110 and the vertical edges 112 of the implanted regions 14, 24 lie within the amorphized region. However, as in any implantation, a small number of ions may reach a greater depth than that which is considered the bottoms 108, 110 of the counter-doped source/drain regions. Thus, the implants should be performed such that the concentration of ions which reach locations at or below the boundary 70 of the amorphized region 16 are several orders of magnitude less than the concentration of the implanted ions at the bottoms 108, 110 of the source/drain and extension implantations.

The bottoms 108, 110 and the vertical edges 112 represent the end of the range of the implantations. Since the bottoms of these implantations, i.e., the end-of-range of the implantations, lay within the amorphized region 16, the later recrystallization of the amorphized region 16 produces few, if any, crystal defects due to implantation damage in the amorphous layer at the bottoms 108, 110 and edges 112.

Figure 6:
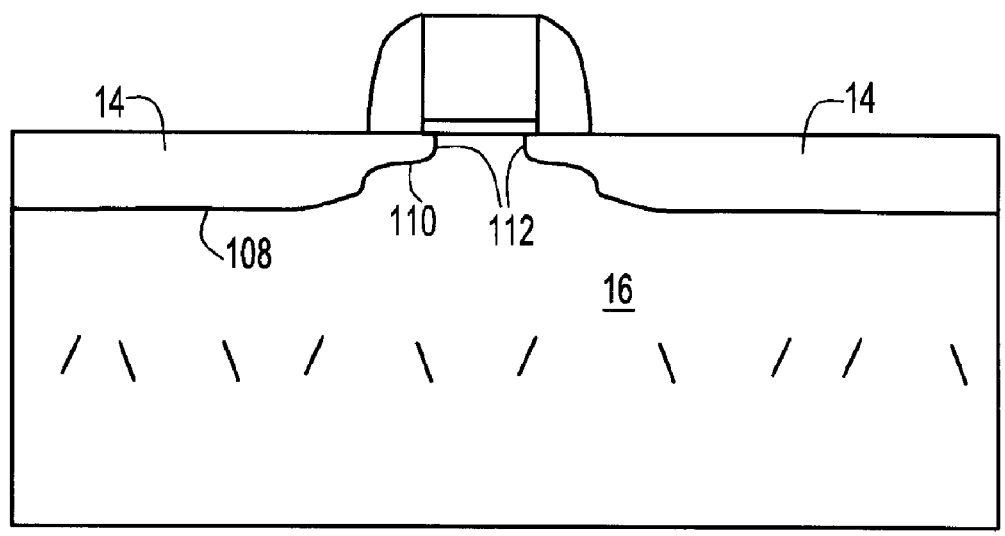

Referring to FIG. 6, thereafter, a low temperature anneal is performed, preferably at a temperature of about 550° C., to recrystallize the amorphized region 16. After recrystallization, few if any crystal defects are present in the recrystallized region 16, despite the prior implantations. The recrystallization process proceeds more quickly than the diffusion of dopants within region 16. For this reason, even fast diffusing dopant species such as boron and phosphorous diffuse very little (less than about 2 nm) when the 0.1 μm thick region 16 is recrystallized, such that very thin and abrupt p-n junctions are formed at the boundaries 108, 110 and 112 of the source/drain regions 14 and the extension regions 24. Such thin p-n junctions are highly desirable to provide what is referred to as "ultra-shallow" junctions for deep sub-micron size transistors.

Figure 7:
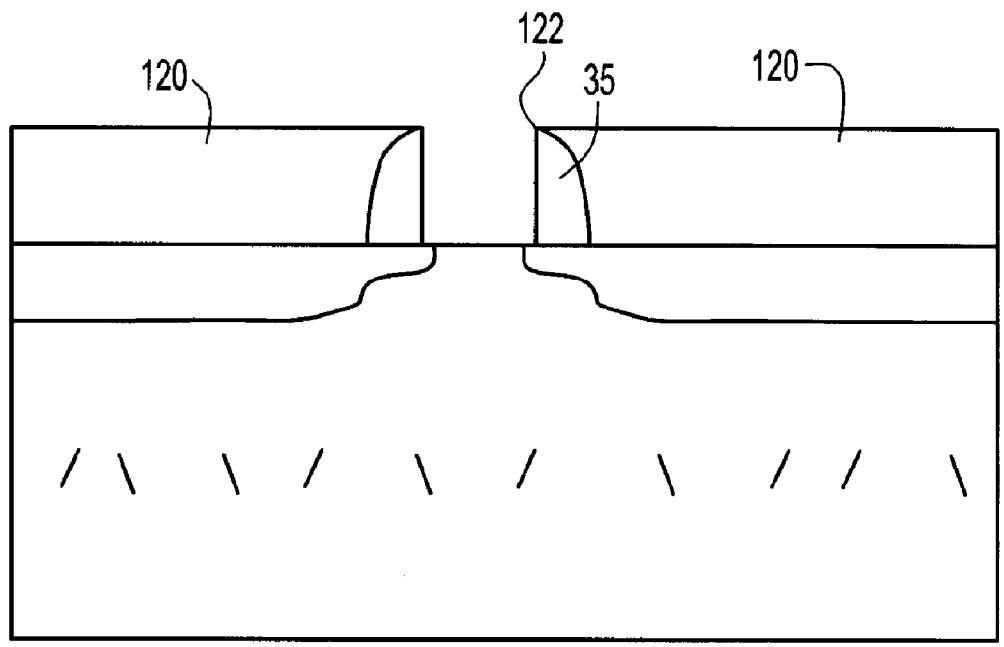

Thereafter, as illustrated in FIG. 7, further steps are performed to remove the initial dummy gate. The initial sacrificial layer 72 (FIG. 4), deposited at low temperature, usually has inadequate properties to function as the final gate dielectric of the transistor, although, in one embodiment, a method of plasma-assisted-oxidation could be used to form high quality oxide at low temperature for gate dielectric in FIG. 4. Therefore, after the recrystallization process, the dummy gate is removed, as well as the sacrificial layer. This is preferably performed as follows. A dielectric region 120, preferably formed of an oxide such as a TEOS oxide or a doped or undoped silicate glass, is deposited, preferably at a low temperature ranging between about 200° C. and 500° C. to avoid dopant diffusion, and more preferably at a temperature of about 300° C., to cover the structure including the dummy gate and spacers 35. Thereafter, the oxide region 120 is planarized by a process such as chemical mechanical polishing (CMP), the process being endpointed when the top 122 of the nitride spacers 35 is exposed, or alternatively, when the polysilicon of the dummy gate is exposed. Thereafter, the dummy gate and the sacrificial layer are removed in order, first by etching the polysilicon material of the dummy gate from between the spacers 35, selectively to the material (nitride) of the spacer and then etching the sacrificial layer, selectively to nitride.

Figure 8:
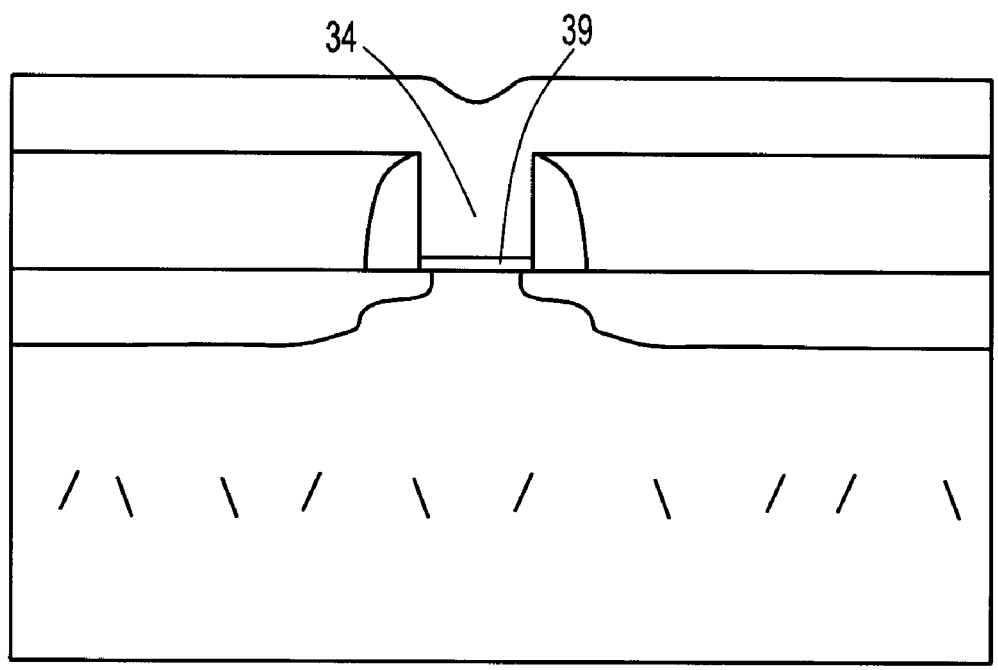

Thereafter, as illustrated in FIG. 8, steps are performed to form the final gate dielectric and to begin forming the final gate conductor. Preferably, an initial pre-clean step is performed using hydrofluoric acid (HF), after which a gate dielectric 39 is formed, as by a thermal oxidation of the exposed silicon crystal of region 16. Alternatively, the gate dielectric can be formed by other processing such as thermal nitridation, or an oxide or nitride layer formed by lowpressure chemical vapor deposition (LPCVD). In another alternative, the gate dielectric can be formed by deposition of a high dielectric constant (high-K) material, according to known processes, resulting in a thin a dielectric constant K of five or more, and preferably greater than about 10. A gate conductor material 34 is then deposited such as a metal or polysilicon, which is in situ doped to a desired dopant profile.

Figure 9:
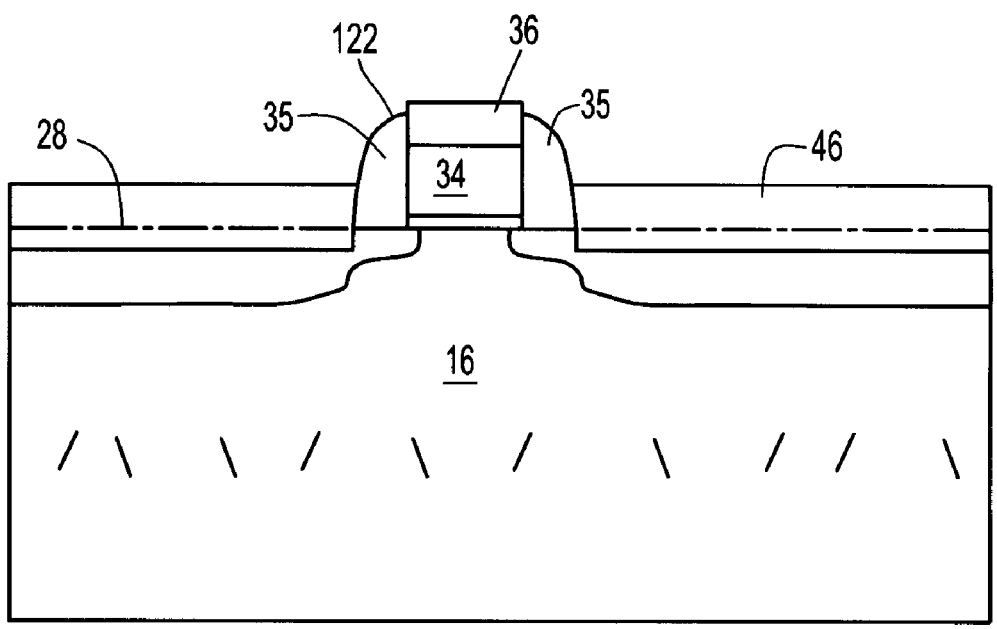

Referring to FIG. 9, thereafter, the gate conductor material 34 is planarized to the top 122 of the nitride spacers 35, after which the overlying oxide region is removed, as by a wet etch performed selectively to silicon, which stops on the major surface 28 of the substrate. Thereafter, processing is performed to activate dopants in the source/drain regions 14, the source/drain extensions 24 and/or the channel region 12 (FIG. 1A). In one example, a laser anneal is used for this purpose. The laser anneal is desirably performed at an energy which is insufficient to melt the localized portion of single-crystal silicon region that is heated by the laser, such that dopants diffuse only minimally due to the highly localized heating produced by the laser. Thus, a non-melting laser anneal is used because it allows annealing to be performed while limiting the distance that dopants travel due to the anneal. In such way, the width of the p-n junction is kept narrow, which is desirable from a performance perspective. Alternatively, other heating methods could be used which limit dopant diffusion, such as rapid thermal annealing (RTA).

Thereafter, referring again to FIG. 9, steps are conducted to form self-aligned silicide regions 46 overlying the source/drain regions and to form a silicide region 36 overlying the gate conductor 34. These silicide regions are preferably formed simultaneously by depositing a silicide precursor material, e.g., a metal, then heating the structure to react the material with the underlying silicon present at the major surface 28 of the region 16 (and at the surface of the polysilicon portion 34 of the gate conductor) to form the silicide, again by a low temperature process so as to limit dopant diffusion. Thereafter, the metal which remains on the sidewalls of the spacers 35 is removed, as by etching selectively to the silicide which has thus been formed.

Finally, referring to FIG. 1A, steps are performed to complete the final FET 10, as follows. A final dielectric region 40 is formed, e.g., by deposition of an oxide such as a doped or undoped silicate glass, TEOS oxide or other oxide, the deposition performed at low temperature in order to limit dopant diffusion. For a low temperature back end of line process, a plasma assisted oxidation performed at temperature under 500° C. can be used, more preferably at around 300° C., such as a high density plasma (HDP) deposition or other low temperature oxide deposition, e.g. low temperature TEOS (LTO), followed by chemical mechanical polishing (CMP). Thereafter, via holes are etched into the dielectric region 40, which are then filled to form the conductive vias 38, 44 and 47 as shown in FIG. 1A.

While the invention has been described in accordance with certain preferred embodiments thereof, those skilled in the art will understand the many modifications and enhancements which can be made thereto without departing from the true scope and spirit of the invention, which is limited only by the claims appended below. For example, in a particular embodiment, amorphous silicon is deposited to overlie a single-crystal silicon region of a substrate at a boundary having a first depth. Thereafter, ion implants are performed into the amorphous silicon region to define source/drain portions and their p-n junction interfaces to a channel region, at a second depth which is significantly less than the first depth. Heating is thereafter performed to recrystallize the source/drain portions such that comparatively few dislocations in the crystal structure occur at the p-n junctions than at the boundary between the first depth and the second depth. Subsequent thereto, a part of the recrystallized region is locally heated to activate a dopant in at least one of the channel portion and the source/drain portion.

What is claimed is:

1. A method of forming a field effect transistor, comprising:
   forming an amorphized semiconductor region having a first depth from a single-crystal semiconductor region;
   subsequently forming a first gate conductor above a channel portion of said amorphized semiconductor region;
   implanting a first dopant including at least one of an n-type dopant and a p-type dopant to a second depth into portions of said amorphized semiconductor region not masked by said first gate conductor to form source/drain portions adjacent to said channel portion;
   heating said substrate to recrystallize said channel portion and said source/drain portions of said amorphized semiconductor region; and
   after said heating step, locally heating at least a part of said recrystallized semiconductor region to activate a dopant in at least one of said channel portion and said source/drain portion.

2. The method as claimed in claim 1, wherein the step of heating is performed for a limited time at a temperature of less than about 600° C., such that said recrystallization proceeds more rapidly than a diffusion of said first dopant.

3. The method as claimed in claim 2, wherein after locally heating step, said concentration of said first dopant varies by at least two orders of magnitude within a distance of less than about five nanometers at boundaries between said channel portion and said source/drain portions.

4. The method as claimed in claim 3, wherein said step of forming said amorphized semiconductor region includes a step of heating said substrate to recrystallize a bottom portion of said amorphized semiconductor region, such that a top portion of said amorphized semiconductor region above said bottom portion remains amorphized.

5. The method as claimed in claim 1, farther comprising, prior to said step of implanting said first dopant to form said source/drain portions, implanting said first dopant to form source/drain extension portions adjacent to said channel portion using said first gate conductor as a mask, and forming spacers on sidewalls of said first gate conductor, wherein said implanting to form said source/drain portions is performed using said first gate conductor and said spacers as a mask.

6. The method as claimed in claim 5, wherein said locally heating step is performed by laser annealing to locally heat at least parts of said source/drain portions, substantially without melting a semiconductor material of said recrystallized semiconductor region.

7. The method as claimed in claim 6, wherein said locally heating step includes locally heating at least parts of said source/drain extension portions and said channel portion to activate at least one dopant in said source/drain extension portions and said channel portion.

8. The method as claimed in claim 1, wherein said first depth is substantially greater than said second depth.

9. The method as claimed in claim 5, further comprising replacing said first gate conductor with a final gate conductor.

10. The method as claimed in claim 9, further comprising forming a sacrificial layer on said amorphized semiconductor region prior to forming said first gate conductor, wherein said step of replacing said first gate conductor is performed by removing said first gate conductor and said sacrificial layer from between said spacers, forming a gate dielectric on said recrystallized semiconductor region between said spacers and forming said final gate conductor over said gate dielectric.

11. The method as claimed in claim 10, further comprising implanting a second dopant into said channel portion after removing said first gate conductor, wherein said laser annealing includes locally heating at least a part of said channel portion to activate said second dopant.

12. The method as claimed in claim 1, wherein said substrate is a bulk substrate and said second depth is substantially less than said first depth.

13. The method as claimed in claim 1, wherein said substrate is a semiconductor-on-insulator substrate including a buried oxide layer disposed below a bottom depth of said single-crystal region of said substrate, wherein said first depth extends at least to said bottom depth, and said second depth extends at least to said bottom depth.

* * * * *